United States Patent
Lee et al.

(10) Patent No.: US 6,777,812 B2
(45) Date of Patent: Aug. 17, 2004

(54) SEMICONDUCTOR DEVICES HAVING PROTECTED PLUG CONTACTS AND UPPER INTERCONNECTIONS

(75) Inventors: Kyu-Hyun Lee, Kyunggi-do (KR); Yoon-Soon Chun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/464,591

(22) Filed: Jun. 18, 2003

(65) Prior Publication Data

US 2003/0214046 A1 Nov. 20, 2003

Related U.S. Application Data

(62) Division of application No. 09/840,741, filed on Apr. 23, 2001, now Pat. No. 6,602,773.

(30) Foreign Application Priority Data

Apr. 24, 2000 (KR) .......................................... 2000-21667

(51) Int. Cl.[7] .......................... H01L 23/48; H01L 23/52; H01L 29/40
(52) U.S. Cl. .......................... 257/773; 257/774; 257/775
(58) Field of Search ................................ 257/773–775; 438/666

(56) References Cited

U.S. PATENT DOCUMENTS

| | | | | |
|---|---|---|---|---|
| 5,656,543 A | * | 8/1997 | Chung | 438/625 |
| 5,863,835 A | | 1/1999 | Yoo et al. | 438/666 |
| 5,918,120 A | * | 6/1999 | Huang | 438/239 |
| 5,976,971 A | * | 11/1999 | Kinpara et al. | 438/637 |
| 6,001,660 A | | 12/1999 | Park et al. | 438/3 |
| 6,011,311 A | * | 1/2000 | Hsing et al. | |
| 6,028,362 A | * | 2/2000 | Omura | 257/774 |
| 6,040,627 A | * | 3/2000 | Harada et al. | 257/752 |
| 6,066,559 A | * | 5/2000 | Gonzalez et al. | |
| 6,100,155 A | * | 8/2000 | Hu | 438/386 |
| 6,232,215 B1 | * | 5/2001 | Yang | 438/622 |
| 6,265,257 B1 | * | 7/2001 | Hsu et al. | 438/215 |
| 6,566,241 B2 | * | 5/2003 | Chun | 438/618 |
| 2003/0049903 A1 | * | 3/2003 | Mitani | 438/253 |

FOREIGN PATENT DOCUMENTS

JP          10178160          6/1998

\* cited by examiner

*Primary Examiner*—John F. Niebling
*Assistant Examiner*—Angel Roman
(74) *Attorney, Agent, or Firm*—Myers Bigel Sibley & Sajovec

(57) ABSTRACT

Embodiments of methods of fabricating protected contact plugs include forming an electrically insulating layer having a contact hole therein, on a semiconductor substrate and then forming an electrically conductive lower barrier layer that lines at least an upper portion of a sidewall of the contact hole. This lower barrier layer may comprise titanium nitride (TiN). A step is also performed to form an electrically conductive contact plug that extends in the contact hole, is electrically coupled to the lower barrier layer and protrudes above the electrically insulating layer. The contact plug may comprise tungsten (W). An electrically conductive upper barrier layer is then formed that extends on a protruded upper surface of the contact plug and on a surface of the lower barrier layer. A step may then be performed to pattern the upper barrier layer to define an electrically conductive barrier spacer that extends on a sidewall or end of the lower barrier layer and define an upper barrier layer cap on the protruded upper surface of the contact plug.

14 Claims, 7 Drawing Sheets

SEMICONDUCTOR DEVICES HAVING PROTECTED PLUG CONTACTS AND UPPER INTERCONNECTIONS

RELATED APPLICATIONS

This application is a divisional of U.S. application Ser. No. 09/840,741 filed Apr. 23, 2001, now U.S. Pat. No. 6,602,773, which is related Korean Application No. 2000-21667, filed Apr. 24, 2000, the disclosures of which are hereby incorporated herein by reference.

FIELD OF THE INVENTION

The present invention relates to semiconductor devices, and more particularly to methods for fabricating semiconductor devices having plug contacts and upper interconnections on a processing substrate.

BACKGROUND OF THE INVENTION

As the horizontal dimensions continue to decrease, accompanying with an increasing integrated circuit density, the aspect ratio (depth to wide) increases and it becomes increasingly difficult to etch reliable contact holes. It is, therefore, important to provide a technique to fill a narrower hole with conductive materials.

On the other hand, the topological width of contacts or interconnections is decreased in order to increase the density of the integrated circuit. However, as there are technical limits such as a resolution of an exposure device, it is difficult to remarkably reduce critical dimension (CD) in processes for a semiconductor device. Besides, an alignment margin in the exposure process is reduced due to micronized elements.

With respect to a smaller margin in aligning an exposure pattern, a damascene process can be used where plug contacts are connected with interconnections on a right junction. The damascene method for DRAMs employing a capacitor on bit line (COB) structure is disclosed in Japanese publication No. 10178160A. It may be possible to improve processing margins in forming lines or connections by means of the damascene method together with a self-alignment technique.

Despite the advanced processing techniques, a more accelerated integration rate for a semiconductor memory device causes new demands for upgrading manufacturing technologies adaptable thereto, arising from the resolution and alignment in the exposure process, and shaping plug contacts.

In case that the widths of a bit line and a contact hole are designed to be 100 $\mu$m and over 90 $\mu$m, respectively, and a limitation of an exposure alignment is over 50 $\mu$m, even though the bit line is within these limitations, there is no guarantee that the bit line will cover the plug contact in the contact hole completely. In another case that the widths of a bit line and a contact hole are 80 $\mu$m and at least over 100 $\mu$m, respectively, it is impossible that the bit line completely covers the plug contact in a junction. Under those conditions, the damascene process disclosed in the Japanese publication No. 10178160A may not be useful. In other words, in shaping self-aligned bit lines, a gap between storage electrode plug contacts and bit lines becomes small (as much as a thickness of a spacer,) and thereby a parasitic capacitance between the plug contacts and the bit lines increases. Therefore, the bit lines would typically not be formed with a sufficient margin as well as the advantage of the damascene process. In known manners except the damascene process, upper interconnections may not cover a region of the contacts.

Figure 1:
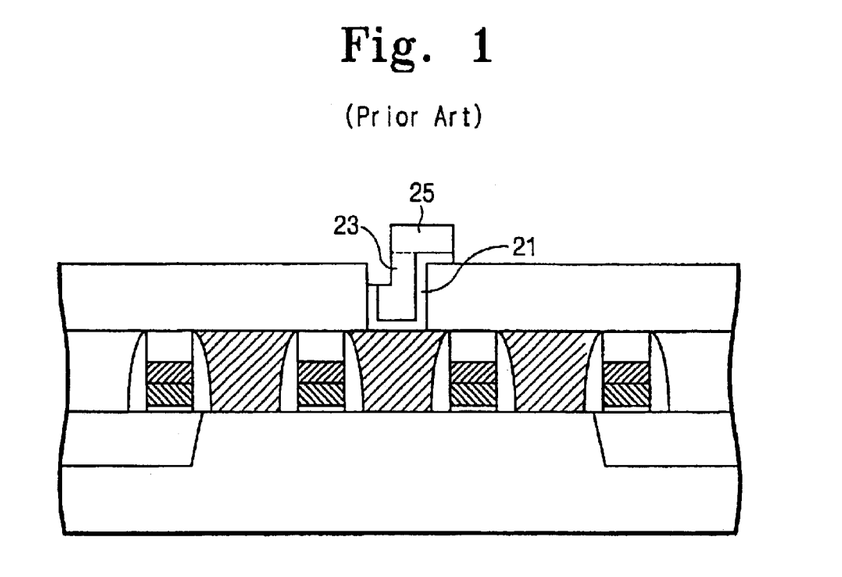
FIG. 1 is a schematic cross-sectional view showing the general DRAM device being consumed of an outer barrier metal enclosing a plug contact in fabricating bit line contacts concurrently with bit lines of the conventional art.

A general method of fabricating bit lines concurrently with plug contacts is now described, referring to FIG. 1. A metal interconnection 25 is aligned to cover a plug contact 23 and a barrier layer pattern 21 sufficiently, as shown in FIG. 1. Accordingly, the portions of the plug contact 23 and the barrier layer pattern 21 are recessed.

The barrier layer pattern 21 is recessed by etching a barrier layer to form a bit line. First, in a process of etching a metal layer for making the metal interconnection 25, a portion not covered with an etching mask is consumed to shape a concave portion. The concave portion caused from over-etching is increasingly attacked, so that a portion full of plug contacts is recessed to expose the barrier layer on a sidewall thereof. Consequently, the barrier layer can be attacked in a process of forming the barrier layer pattern 21 by removing the barrier layer stacked on an intermediate insulating layer.

Furthermore, the etching of the barrier layer pattern 21 is advanced along the attacked portion when removing residues on the intermediate insulating layer using an over etching of the barrier layer, and thereby the barrier layer extending between the plug contact and the intermediate insulating layer may be mostly removed.

As the damage is increased, the amounts of fluorine elements, supplied as an etching gas or generated in the etching process, that permeate into an interface between a silicon layer and the barrier layer under the plug contact are increased. And the permeated fluorine elements form a nonconductor layer such as $SiF_4$ on the interface. Otherwise, the fluorine elements may be latent for a while, and react with the barrier layer of the interface by means of a following heating process. In this case, the reaction forms the nonconductor and makes the interface separate, so that the semiconductor elements are difficult to operate normally in addition to having increased contact resistance.

SUMMARY OF THE INVENTION

According to an aspect of the present invention, there is provided a semiconductor device formed of an intermediate insulating layer, formed on a semiconductor substrate, having a contact hole in which a region of the substrate is exposed, and a lower barrier layer covering a sidewall and bottom of the contact hole. On the barrier layer, a plug contact being filled in the contact hole is provided, and a predetermined portion is protruded above the top surface of the intermediate insulating layer. Further, the protruded portion, at least a part, of the plug contact is covered with an upper barrier layer pattern which is covered with a metal interconnection thereon. A spacer, made of the same material as the upper barrier layer pattern, is in a sidewall of the protruded portion of the plug contact.

A predetermined region of the semiconductor substrate exposed through the contact hole is mostly a dopant region which is doped over a silicon substrate or a polysilicon pad. An ohmic metal layer may be intervened between the lower barrier layer pattern and the sidewall and bottom of the contact hole. The lower barrier layer pattern and the ohmic metal layer pattern are composed of a titanium nitride (TiN) and a titanium (Ti), respectively. The plug contact generally uses tungsten (W). The upper layer pattern may use TiN, and the upper metal interconnection may use W or copper (Cu). Further, the present invention is adaptable to fabricate bit line contacts and bit lines of DRAM devices employing a capacitor on bit line (COB) structure.

According to another aspect of this invention, a method for fabricating a semiconductor device begins by forming an intermediate insulating layer on a semiconductor substrate, and patterning to expose a predetermined region of the substrate. Thereafter, a lower barrier layer and a metal layer are sequentially deposited over an inner side of the contact hole.

In general, a method for depositing the layers includes the steps of depositing the lower barrier layer and the metal layer over an entire surface of the substrate, planarizing the metal layer to form a plug contact, and etching an entire surface of the lower barrier layer to expose a top surface of the intermediate insulating layer. Here, a recessed lower barrier layer pattern may be formed to expose an upper sidewall of the contact hole by over etching. The intermediate insulating layer is to be recessed by an entire surface etching over the layer, so that an upper portion of the plug contact becomes higher than the top surface of the intermediate insulating layer. And then, the upper barrier layer pattern which covers at least a part of the protruded portion of the plug contact and a metal interconnection are formed by utilizing a method of depositing the upper barrier layer and the metal layer over the entire surface of the substrate, and etching the layers after forming a mask pattern.

To form the upper barrier layer pattern and the metal interconnection, the upper barrier layer and an interconnection metal layer are sequentially deposited after a portion of the plug contact is protruded. The interconnection metal layer and the upper barrier layer are sequentially etched by using a general patterning process.

If the plug contact uses tungsten (W), a method for the planarization employs the entire surface etching or a chemical mechanical polishing (CMP) method. When the lower barrier layer pattern enclosing the plug contact is recessed below the top surface of the intermediate insulating layer, it is preferable that the entire surface etching of the intermediate insulating layer is advanced to be the same level with the top surface of the lower barrier layer pattern. If the lower barrier layer pattern is not recessed, the entire surface etching of the intermediate insulating layer is advanced to be lower than the top surface of the lower barrier layer pattern.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. However, when a layer or region is described as being "directly on" another layer or region, no intervening layers or regions are present. Like numbers refer to like elements throughout. Moreover, the terms "first conductivity type" and "second conductivity type" refer to opposite conductivity type such as P or N-type, however, each embodiment described and illustrated herein includes its complementary embodiment as well.

Figure 2:
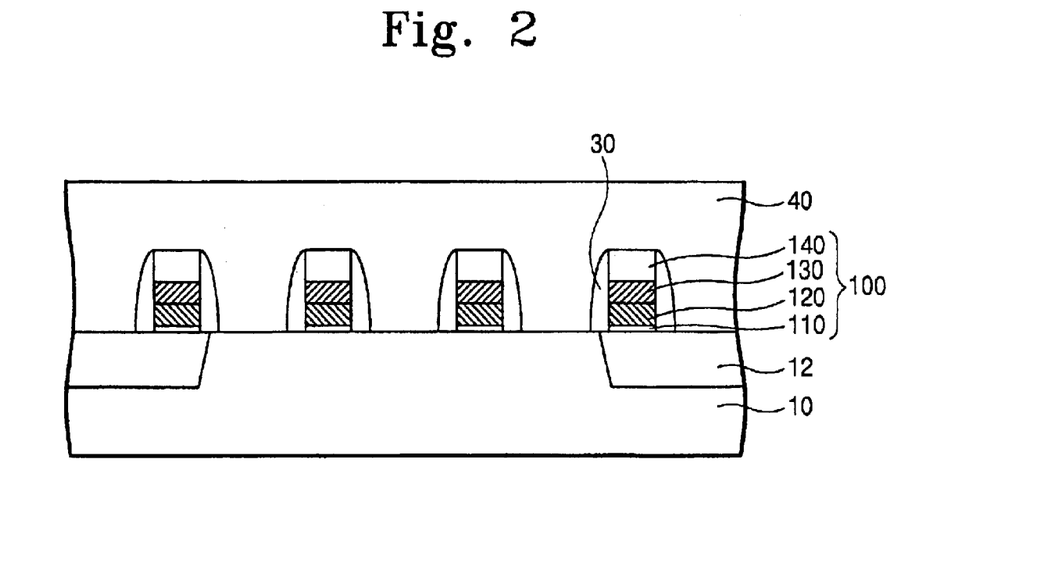
FIGS. 2 through 10 are schematic cross-sectional views showing a sequence of process steps for fabricating bit line plug contacts and bit lines in DRAM devices according to a preferred embodiment of the present invention.

FIGS. 2 through 10 are schematic cross-sectional views showing the sequence of process steps for making the DRAM devices employing a capacitor on bit line (COB) structure according to a preferred embodiment of the present invention. Referring to FIG. 2, the method begins by separating elements by forming an element separate film 12 on a semiconductor substrate 10 using a shallow trench isolation (STI) method. Then, a gate pattern 100 is formed by sequentially depositing a gate insulating layer 110, a polysilicon layer 120, a tungsten suicide (WSi$_2$) layer 130, and a capping silicon nitride layer (SiN) layer 140 on the substrate 10, and patterning by means of photolithography and etching, as commonly practiced in the industry. A silicon dioxide (SiO$_2$) layer (not shown) may be deposited on the capping SiN layer 140 and patterned. In this case, after the SiO$_2$ layer is patterned by using a general method, the SiO$_2$ layer pattern thereof is used as a hard mask in etching the lower layers. Then, a gate pattern having the SiO$_2$ layer on the top is formed.

Next, a low dose dopant ion implantation step is conducted to form lightly doped drains (LDDs, not shown) on the substrate 10 by using the gate pattern 100 as an ion implantation mask. Insulating spacers 30 are then formed on a sidewall of the gate pattern 100 using conventional techniques. Then, a dopant ion implantation step is carried out over the entire surface, using the gate patterns 100 and the spacers 30 as an implant mask. The LDD-type source/drain region (not shown in FIG. 2) is made in active regions on both sides of the gate pattern 100 using conventional techniques.

A lower intermediate insulating layer 40 is then stacked and planarized. The planarization is required for the following exposure or chemical mechanical polishing (CMP) processes, etc., and the intermediate insulating layer 40 uses a boro phosphorous silicate glass (BPSG) appropriate to fill a space and to be planarized.

Figure 3:
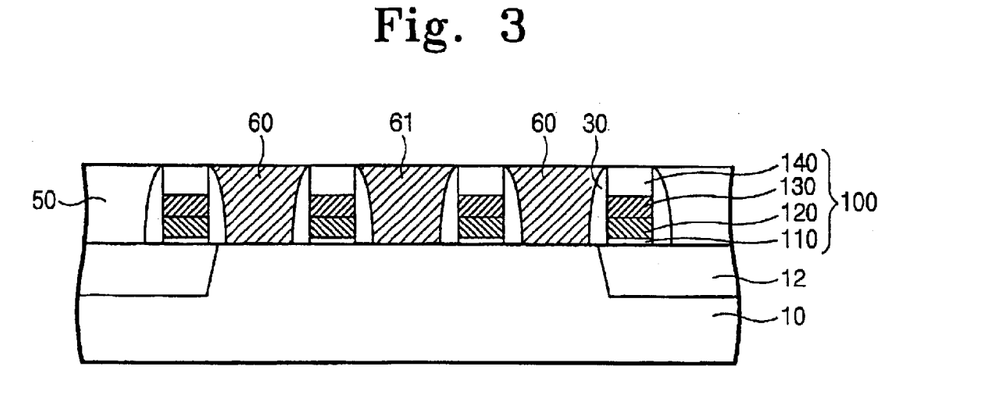

FIG. 3 shows a process step of making contact pads. The outcome of the planarized lower intermediate insulating layer 40 shown in FIG. 2 is patterned to form the contact pads 60 shown in FIG. 3. During the patterning step, the capping SiN layer 140 and the spacer 30 enclosing the gate pattern 100 function (with a general photo-resist etching mask (not shown) as an etching mask. Therefore, a portion of the lower intermediate insulating layer 40, which is not protected by the photo-resist etching mask, is removed, so that the active regions between the gate patterns 100 are exposed in a self-alignment manner. A polysilicon layer is then formed over the entire surface of the substrate using a chemical vapor deposition (CVD) method, followed by removing the remaining photo-resist pattern.

Next, the interconnected polysilicon on the capping SiN layer 140 of the gate pattern 100 is removed to separate a bit line contact pad 61 and a storage contact pad 60. A method for separating the contact pads 60 and 61 begins by etching back the polysilicon deposited on the lower intermediate insulating layer 40. The lower intermediate insulating layer 40 is removed, starting from the top surface thereof, by means of CMP, so that a recessed lower intermediate insulating layer 50 is formed. The polysilicon layer is concurrently recessed. In this manner, the CMP process is advanced until the contact pads 60 and 61 are separated. Such contact pads 60 and 61 are self-aligned contact pads.

Figure 4:
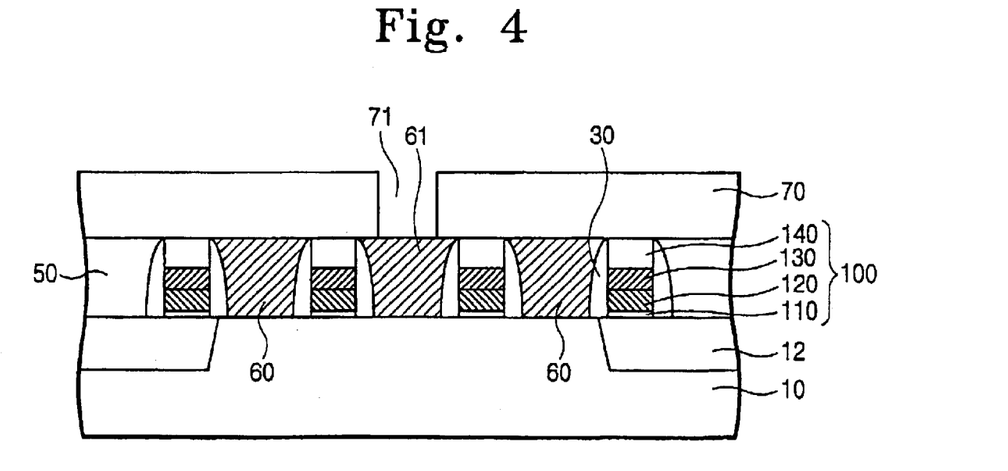

FIG. 4 shows a cross sectional view of a process for making a contact hole 71. Referring to FIG. 4, an upper intermediate insulating layer 70 is deposited on the entire surface of the substrate 10 having the contact pads 60 and 61. Mostly, the upper intermediate insulating layer 70 is composed of plasma enhanced tetraethylortho silicate (PETEOS), and is deposited to a thickness of between about 1500 and 2000 Angstroms. Further, the upper intermediate insulating layer 70 is patterned to expose the bit line contact pad 61, and to form the contact hole 71 thereby. The contact hole 71 is preferably formed to have a width of between 90 and 140 microns.

Figure 5:
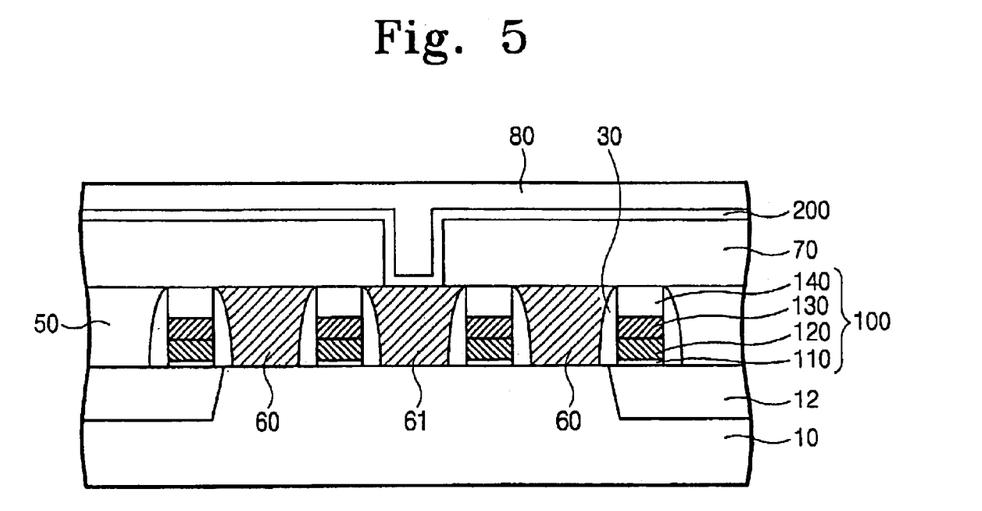

Referring next to FIG. 5, a lower barrier layer 200 is conformally formed over the entire surface of the upper intermediate insulating layer 70 having the contact hole 71. The barrier layer 200 is mostly formed using TiN by means of CVD process. An ohmic metal layer (not shown), may be formed in the contact hole 71 prior to forming the barrier layer 200. The ohmic metal layer may comprise titanium. Next, a metal layer 80 is deposited. The metal layer 80 is mostly a tungsten (W) layer deposited to a thickness of over 1000 Angstroms using CVD to fill the contact hole 71. Here, the Ti layer decreases the contact resistance by forming a titanium silicide ($TiSi_2$) layer with the polysilicon layer of the contact pads 60 and 61 during a following annealing process. Further, the TiN within the barrier layer 200 prevents Ti from being removed by a chemical reaction with fluorine generated during a CVD step for forming a tungsten (W) plug, described below.

Figure 6:
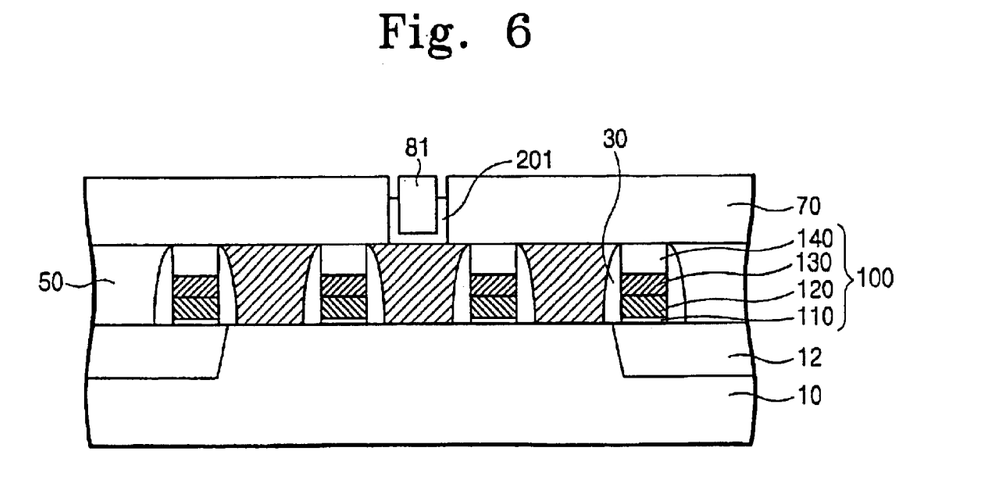

The metal layer 80, stacked over the top surface of the upper insulating layer 70, is removed to form a plug contact 81 shown in FIG. 6. Referring now to FIG. 6, the entire surface of the metal layer 80 is etched to form the plug contact 81. The entire surface of the lower barrier layer 200 under the metal layer 80 is also etched to remove residues on the upper intermediate insulating layer 70. The etchings for the metal layer 80 and the lower barrier layer 200 are performed under different conditions. For the metal layer 80 of tungsten, a gas such as $CCl_2F_4$, $CF_4$ or $CF_4$—$O_2$, based on fluorine, is used, while for the lower barrier layer 200 (regardless of Ti/TiN layers), a compound of a fluorine gas such as $SF_6$, $CF_4$, or $CHF_3$ and of a chlorine gas such as $CCl_4$, $Cl_2$, or $BCl_3$ is used.

The step of etching the tungsten layer 80 is stopped upon sensing the lower barrier layer 200 by means of end point detection (EPD), or stopped after an over etching for a few seconds. Accordingly, the plug contact 81 is at about the same level with the top surface of the upper intermediate insulating layer 70. Since W is used for the metal layer 80, a tungsten CMP step also may be used instead of the etching step.

When the entire surface of the lower barrier layer 200 under the metal layer 80 is etched, conductive residues may remain on the upper intermediate insulator layer 70. Further, if residues remain, an unwanted conductive pattern, (i.e. a bridge between the bit lines) may be formed. Hence, the lower barrier layer 200 is over etched by about 30% of the etching time typically needed to remove the lower barrier layer 200. During the over etching process, the lower barrier layer 200 enclosing the plug contact 81 is recessed to form a lower barrier layer pattern 201, as illustrated.

Although the thickness of the stacked lower barrier layer 200 is relatively thin, a recessed depth of the lower barrier layer pattern 201 may be about 500 Angstroms after the over etching process. This is because the narrow portion of the barrier layer 200 extending between the upper intermediate insulating layer 70 and the plug contact 81 is etched faster than the other parts.

Figure 7:
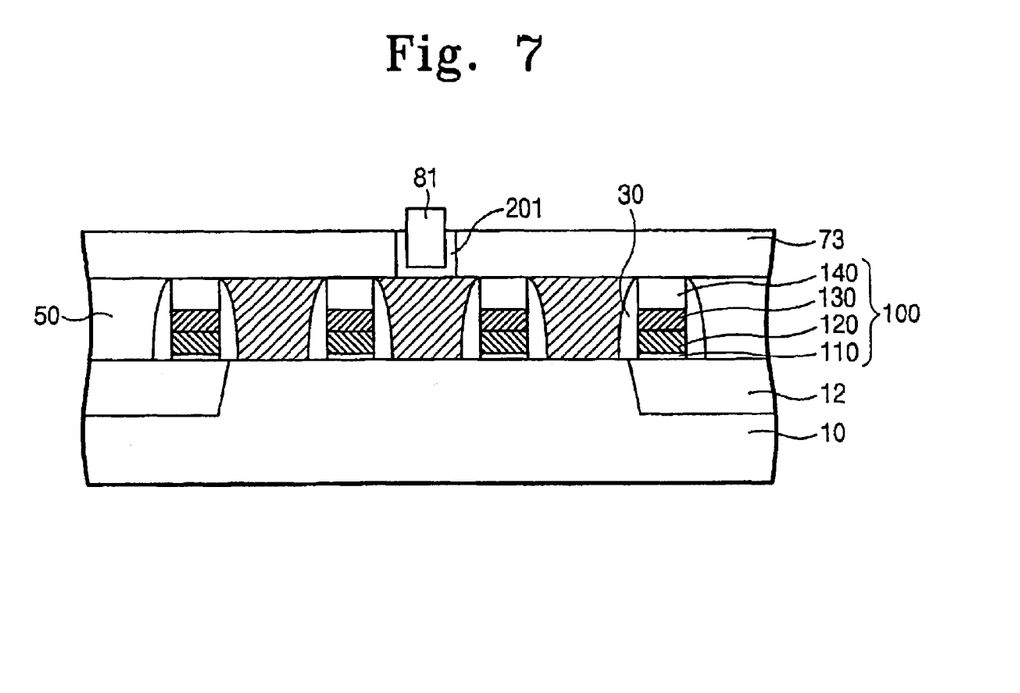

Referring to FIG. 7, the reference number 73 identifies a recessed upper intermediate insulating layer made by etching the entire surface of the upper intermediate insulating layer 70. It is preferable that a top surface of the recessed upper intermediate insulating layer 73 is at the same level with a top part of the recessed lower barrier layer pattern 201. The plug contact 81 is thereby protruded higher than the top surface of the recessed upper intermediate insulating layer 73, as shown in FIG. 7.

The upper intermediate insulating layer 70 may be etched by 500 Angstrom and as much as the recessed depth of the over-etched lower barrier layer pattern 201. Accordingly, the recessed upper intermediate insulating film 73 has a thickness of between about 1000 and 1500 Angstroms and an upper part of the plug contact 81 protrudes by about 500 Angstroms relative to the top surface of the recessed intermediate insulating layer 73.

Figure 8:
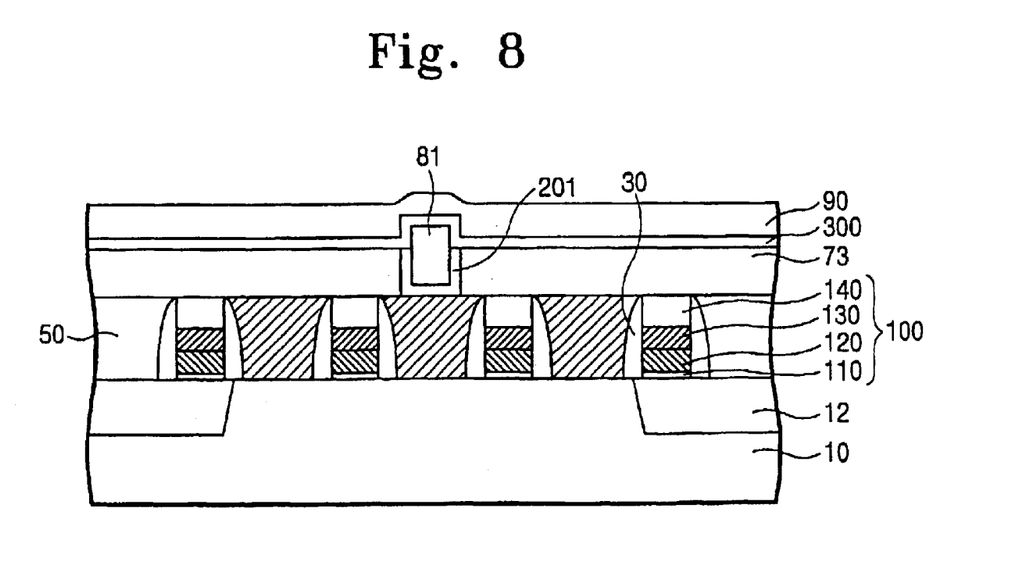

Referring now to FIG. 8, an upper barrier layer 300 and an interconnection metal layer 90 are sequentially deposited over the plug contact 81, as illustrated. The upper barrier layer 300 may comprise TiN. The interconnection metal layer 90 is mostly formed by depositing a tungsten (W) layer to a thickness of about between about 800 and 1000 Angstroms, which corresponds to a thickness of the bit line. Consequently, the protruded upper part of the plug contact 81 is covered with the upper barrier layer 300 and the interconnection metal layer 90 thereon. It is preferable that the upper barrier layer 300 is formed thicker than the lower barrier layer 200.

Figure 9:
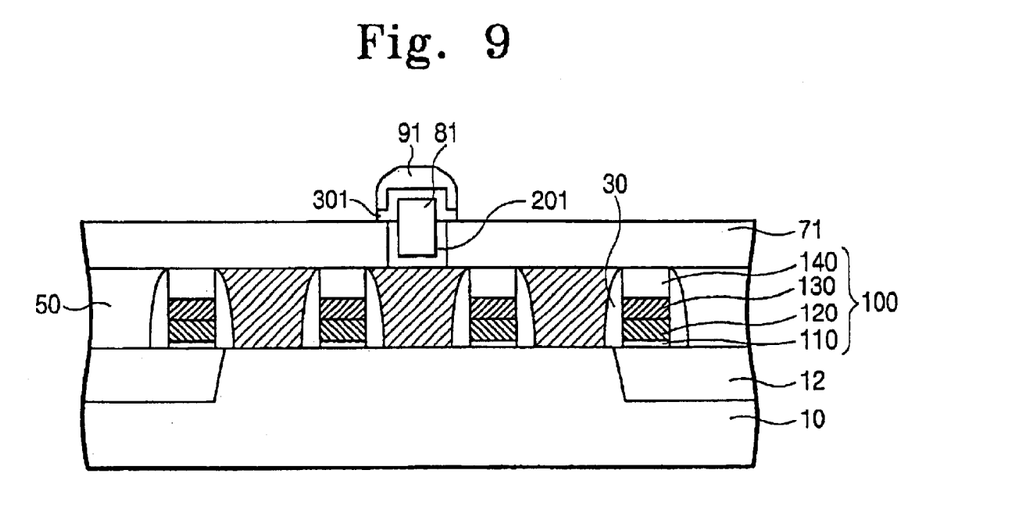
Figure 10:
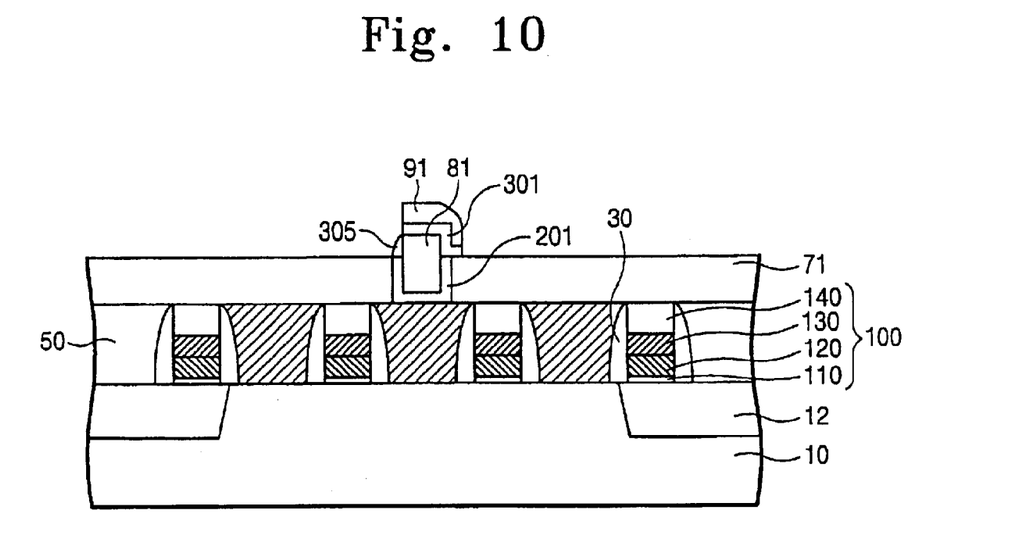

A metal interconnection, or a bit line 91 as shown in FIGS. 9 and 10, is formed by patterning the interconnection metal layer 90 and the barrier layer 300 covering the protruded plug contact 81. FIG. 9 shows a state of the bit line 91 aligned right with the protruded plug contact 81, and FIG. 10 shows a state of the miss-aligned bit line 91 covering a part of the plug contact 81.

More specifically, an upper barrier layer pattern 301 and the metal interconnection 91 are formed by sequentially etching the interconnection metal layer 90 and the upper barrier layer 300 by using a conventional method. At this time, though the metal interconnection 91 is mis-aligned with the plug contact 81, a barrier layer spacer 305 is formed on a sidewall of the protruded part of the plug contact 81. Accordingly, the lower barrier layer pattern 201 is covered with the barrier layer spacer 305 and the upper barrier layer pattern 301 constitutes an upper barrier layer cap. As a result, fluorine elements, decomposed from an etching gas used for etching the interconnection metal layer 90 and the upper barrier layer 300, are prevented from permeating into the lower part of the plug contact 81 through the lower barrier layer pattern 201.

Figure 11:
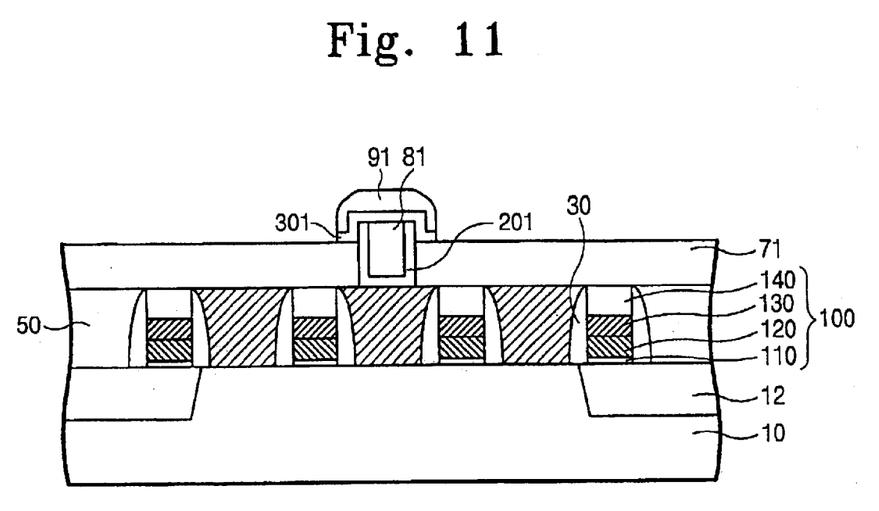
FIGS. 11 through 14 are schematic cross-sectional views showing the DRAM devices by preferred embodiments.
Figure 12:
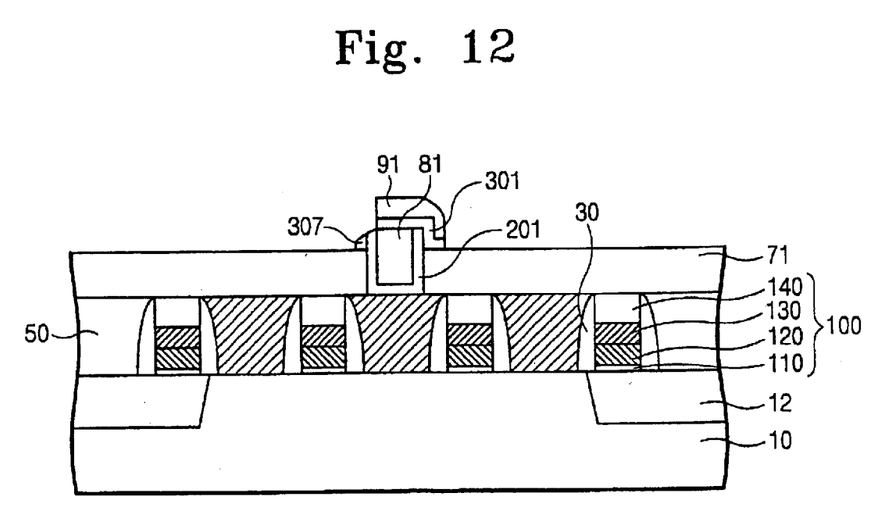

FIGS. 11 and 12 show a cross sectional view of a structural part of another embodiment where the barrier layer pattern 201 is at the same level with the plug contact 81 instead of being recessed as shown in FIG. 6, using a process of forming the plug contact 81 by means of anisotropic etching of the metal layer 80 and the barrier layer 200, as shown in FIG. 5. FIG. 11 shows a correct alignment where the upper barrier layer pattern 301 and the metal interconnection 91 completely cover the plug contact 81 and the lower barrier layer pattern 201 on the sidewall thereof. FIG. 12 shows a mis-aligned state. The lower barrier layer pattern 201 remains like a spacer on the sidewall of the exposed plug contact 81, and an upper barrier layer spacer 307 is additionally made with the upper barrier layer pattern 301. The metal interconnection 91 covers the upper barrier layer pattern 301. In this case, the lower barrier layer pattern 201 can be protected more safely owing to the added spacer 307.

Figure 13:
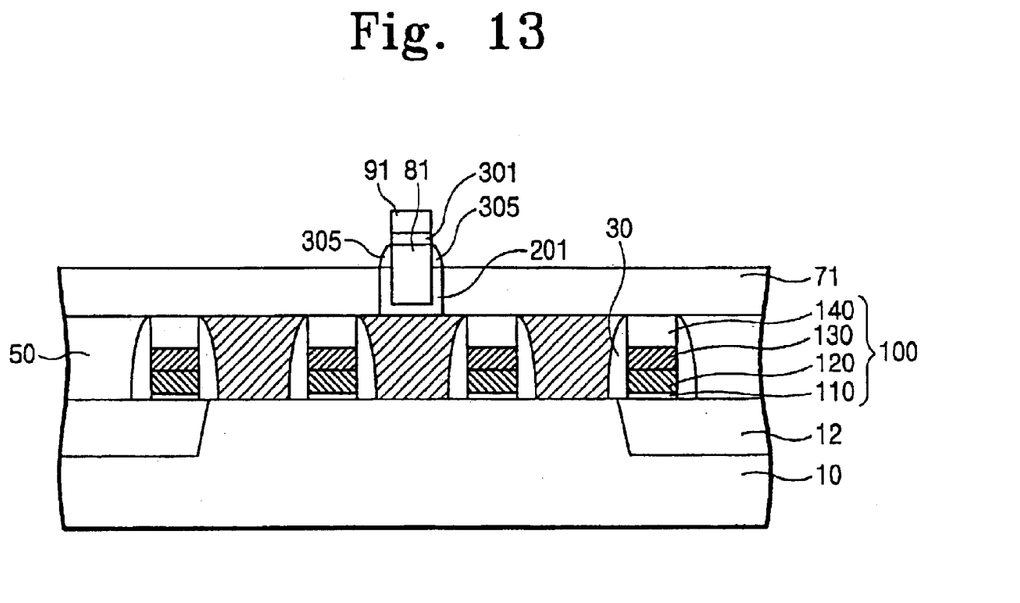

FIG. 13 shows another embodiment where the bit line 91 is aligned right during the patterning process of the bit line 91, but a width thereof is smaller than that of the plug contact 81. Nevertheless, a barrier layer spacer 305 is formed on the sidewall of the plug contact 81, and thereby it prevents the lower barrier layer pattern 201 from being exposed. That is, no matter how narrow the width of the bit line 91, the fluorine element can not permeate into the lower part of the plug contact 81 in patterning the interconnection metal layer 90 and the upper barrier layer 300.

Figure 14:
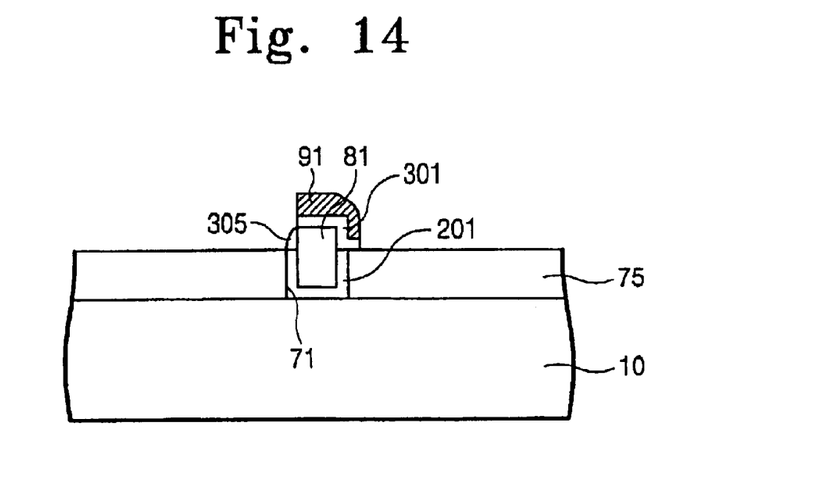

FIG. 14 is a cross sectional view showing a standard construction of a preferred embodiment in the present invention. A lower layer is the semiconductor substrate 10 and the upper layer is the intermediate insulating layer 75. In the insulating layer 75, the contact hole 71 is formed, in which the contact hole 71 is enclosed with the lower barrier layer pattern 201. The lower barrier layer pattern 201 is a composite layer composed of Ti for the ohmic contact layer, and TIN for the barrier layer. The contact hole 71 in the inner side of the lower barrier layer pattern 201 is full of tungsten (W) as the plug contact 81. The plug contact 81 is partly protruded above the intermediate insulating layer 75. The upper barrier layer pattern 301 composed of TiN covers most of the protruded plug contact 81, and the metal interconnection 91 covers the upper barrier layer pattern 301. On a part of the sidewall of a protruded part of the plug contact 81, the barrier layer spacer 305 is formed concurrently with the upper layer pattern 301. The barrier layer spacer 305 covers the lower barrier layer pattern 201 located between the plug contact 81 and the intermediate insulating layer 75. Consequently, the barrier layer spacer 305 prevents the lower barrier layer pattern 201 from being attacked even though over etching occurs when forming the upper barrier layer pattern 301.

According to the semiconductor device of the present invention, the semiconductor device is able to prevent depletion of the dopant from the substrate into the contacts during annealing, thereby inhibiting increases in contact resistance.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A semiconductor device comprising:
   a semiconductor substrate;
   at least two gate patterns on the semiconductor substrate;
   an intermediate insulating layer on the semiconductor substrate and the gate patterns, wherein the intermediate insulating layer defines a contact hole aligned between two of the gate patterns;
   a lower barrier layer pattern covering a sidewall and bottom of the contact hole;
   a plug contact in the contact hole on the lower barrier layer pattern and protruding beyond an adjacent major top surface of the intermediate insulating layer, wherein the plug contact is aligned between two of the gate patterns;
   an upper barrier layer pattern directly on at least a portion of the protruded portion of the plug contact; and
   a metal interconnection on at least a portion of the upper barrier layer pattern.

2. The semiconductor device of claim 1, further comprising a spacer directly on a sidewall of the protruded portion of the plug contact.

3. The semiconductor device of claim 2, wherein the spacer comprises the same material as the upper barrier layer pattern.

4. The semiconductor device of claim 1, wherein the lower barrier layer pattern protrudes beyond a major top surface of the intermediate insulating layer and covers at least a portion of a sidewall of the protruded portion of the plug contact, and further comprising a spacer on the protruding portion of the lower barrier layer pattern and opposite to the plug contact.

5. The semiconductor device of claim 1, wherein the lower barrier layer pattern comprises a plurality of layers of Ti/TiN.

6. The semiconductor device of claim 1, wherein the semiconductor substrate comprises silicon, and the plug contact and the metal interconnection each comprise tungsten (W).

7. The semiconductor device of claim 1, wherein the metal interconnection is a bit line of a DRAM having a capacitor on bit line (COB) structure.

8. The semiconductor device of claim 4, wherein the spacer and the upper barrier layer pattern comprise the same material.

9. The semiconductor device of claim 1, wherein a top of the lower barrier layer pattern is co-planar with the adjacent major top surface of the intermediate insulating layer.

10. The semiconductor device of claim 1, wherein the metal interconnection is directly on at least a portion of the upper barrier layer pattern.

11. A semiconductor device comprising:
    a semiconductor substrate;
    an intermediate insulating layer on the semiconductor substrate, the intermediate insulating layer defining a contact hole;
    a lower barrier layer pattern covering a sidewall and bottom of the contact hole, wherein a top of the lower barrier layer pattern is co-planar with an adjacent major top surface of the intermediate insulating layer;
    a plug contact in the contact hole and directly on the lower barrier layer pattern and protruding beyond an adjacent major top surface of the intermediate insulating layer;
    an upper barrier layer pattern on at least a portion of the protruded portion of the plug contact; and
    a metal interconnection on at least a portion of the upper barrier layer pattern.

12. The semiconductor device of claim 11, further comprising at least two gate patterns on the semiconductor substrate, wherein the plug contact is aligned between two of the gate patterns.

13. The semiconductor device of claim 11, wherein the upper barrier layer pattern is directly on at least a portion of the protruded portion of the plug contact.

14. The semiconductor device of claim 11, wherein the upper barrier layer pattern is directly on at least a portion of sidewalls of the protruded portion of the plug contact.

* * * * *